United States Patent
Liu et al.

(10) Patent No.: US 11,031,264 B2
(45) Date of Patent: Jun. 8, 2021

(54) SEMICONDUCTOR DEVICE MANUFACTURING SYSTEM

(71) Applicant: Taiwan Semiconductor Manufacturing Co., Ltd., Hsinchu (TW)

(72) Inventors: Yan-Hong Liu, Zhudong Township (TW); Che-Fu Chen, Taipei (TW)

(73) Assignee: Taiwan Semoconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/443,168

(22) Filed: Jun. 17, 2019

(65) Prior Publication Data
US 2020/0058529 A1    Feb. 20, 2020

Related U.S. Application Data

(60) Provisional application No. 62/764,656, filed on Aug. 15, 2018.

(51) Int. Cl.
| | |
|---|---|
| *H01L 21/67* | (2006.01) |
| *B65G 47/90* | (2006.01) |
| *H01L 21/687* | (2006.01) |
| *H01L 21/677* | (2006.01) |

(52) U.S. Cl.
CPC ........ *H01L 21/67196* (2013.01); *B65G 47/90* (2013.01); *H01L 21/67742* (2013.01); *H01L 21/68707* (2013.01)

(58) Field of Classification Search
CPC ......... H01L 21/67196; H01L 21/67742; H01L 21/68707; H01L 21/67201; H01L 21/67161; H01L 21/67173; B65G 47/90; B05C 15/00; B05B 16/00; B05B 14/44; B65D 90/04; B65D 90/046; B65D 2590/04; B65D 2590/043; B65D 2590/046
USPC ............................................... 141/59, 65, 66
See application file for complete search history.

(56) References Cited

U.S. PATENT DOCUMENTS

| | | | | |
|---|---|---|---|---|
| 5,255,783 | A * | 10/1993 | Goodman | H01L 21/67393 206/711 |
| 9,589,819 | B1 * | 3/2017 | Takano | H01L 21/67196 |
| 2003/0213560 | A1 * | 11/2003 | Wang | H01L 21/67017 156/345.31 |
| 2011/0126936 | A1 * | 6/2011 | Dawson | B65B 31/024 141/10 |
| 2016/0169766 | A1 * | 6/2016 | Ishibashi | H01L 21/67253 73/40 |

(Continued)

*Primary Examiner* — Glenn F Myers
(74) *Attorney, Agent, or Firm* — Sterne, Kessler, Goldstein & Fox P.L.L.C.

(57) ABSTRACT

The present disclosure relates to a semiconductor device manufacturing system. The semiconductor device manufacturing system includes a processing module and a transfer module. The processing module includes a processing chamber that is configured to process a semiconductor wafer and a gate valve that is configured to provide access to the processing chamber. The transfer module includes a transfer chamber that is coupled to the processing chamber and a liner that is coupled to an inner surface of the transfer chamber. The liner is configured to reduce a volume of the transfer chamber prior to or during a transfer chamber pressure adjustment operation of the transfer module.

20 Claims, 6 Drawing Sheets

(56) References Cited

U.S. PATENT DOCUMENTS

| | | | |
|---|---|---|---|
| 2017/0092517 A1* | 3/2017 | Ohashi | H01L 21/67276 |
| 2018/0229945 A1* | 8/2018 | Suzuki | H01L 21/67201 |
| 2019/0096702 A1* | 3/2019 | Sakai | H01L 21/67173 |
| 2019/0148177 A1* | 5/2019 | Yin | H01L 21/67161 |
| | | | 414/221 |

* cited by examiner

SEMICONDUCTOR DEVICE MANUFACTURING SYSTEM

RELATED APPLICATION

This application claims the benefit of U.S. Provisional Patent Application No. 62/764,656, filed Aug. 15, 2018, titled "Semiconductor wafer processing tool," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor device manufacturing systems and the demands for increased throughput of these systems.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
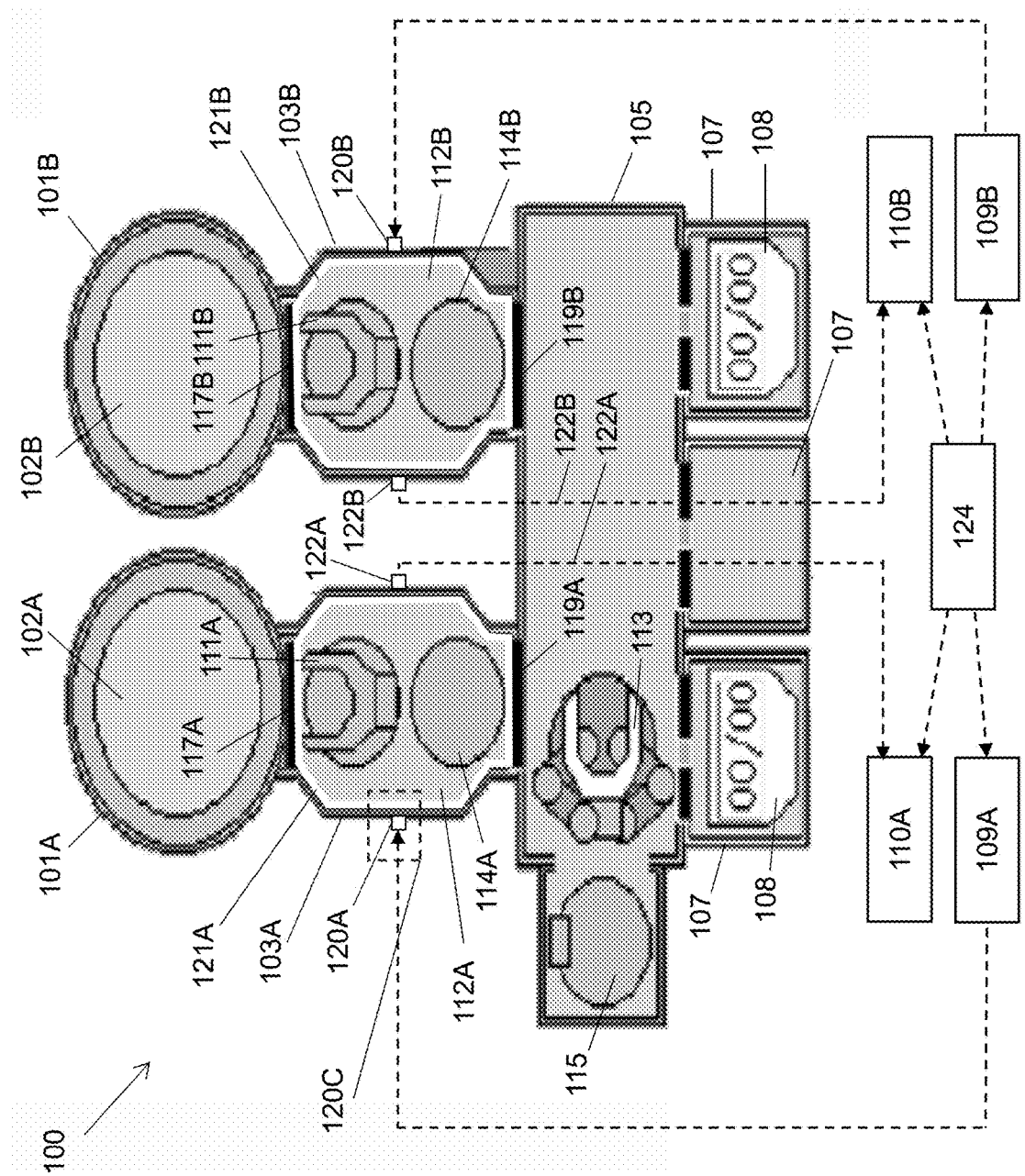
FIG. 1A is a plan view of a semiconductor device manufacturing system, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by, for example, ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Semiconductor substrates (e.g., semiconductor wafers) are subjected to different device manufacturing processes (e.g., wet etching, dry etching, ashing, stripping, metal plating, epitaxy, and/or chemical mechanical polishing) in different processing chambers of processing modules of semiconductor device manufacturing systems during the fabrication of semiconductor devices. The different processing modules can be arranged in a cluster around a central, automated handling unit. Such clusters of processing modules are often referred as cluster tools. The central automated handling unit can include transfer modules that can be configured to transfer the wafers between different processing chambers and/or between processing chambers and wafer storage devices. The wafers are typically transported through transfer modules (sometimes referred as load lock modules) and temporarily stored in batches in the wafer storage devices during intervals between the different processes.

The processing chambers can be configured to provide a vacuum environment to conduct the different processes on the wafers. To conduct the processes in the processing chambers, the wafers are transferred from other processing chambers and/or the wafer storage devices into the processing chambers. The processing chambers are typically pumped down to a desired vacuum pressure prior to receiving the wafers. As a long pumping time (e.g. hours or days) is required to achieve the desired vacuum pressure in the processing chambers and the processing chambers can be exposed to contaminants in the atmosphere when vented, the venting of the processing chambers to atmospheric pressure are typically avoided to reduce wafer processing time, and consequently, increase the throughput of the processed wafers.

Rather than venting the processing chambers to atmospheric pressure to receive the semiconductor wafers, the semiconductor wafers can be transferred to the processing chambers under a vacuum environment through one or more of the transfer modules. The transfer modules can be configured to transfer and receive the wafers to and from the processing chambers under vacuum to reduce the wafer processing time and to reduce contamination in the processing chambers.

A transfer chamber of a transfer module can be coupled to one or more of the processing chambers with gate valves between the chambers. The transfer module can have its own pumping and venting systems. It can include a wafer holder that can hold a number of individual wafers and a mechanical transfer mechanism (e.g., a robotic arm) to move the wafers to and from the processing chambers. The wafers can be loaded into the transfer chamber from storage devices while under atmospheric pressure. The transfer chamber can then be pumped down to a vacuum pressure similar to that of the processing chamber to which the wafers are to be transferred. The gate valve between the transfer chamber and the processing chamber can then be opened and one or more of the wafers can be mechanically transferred to the processing chamber using, for example, a robotic arm of the transfer module. After the wafers are processed, they can be transferred back to the transfer chamber under vacuum in order to be placed back into the wafer storage devices and moved onto the next processing module. During this transfer process the processing chamber can be under vacuum. Thus, the transfer module allows the wafers to be transferred to and from the processing chamber without venting the processing chamber to atmospheric pressure.

With the increase in complexity of semiconductor device manufacturing processes, the number of manufacturing steps performed in the processing chambers also increased. As such, the frequency of access to the transfer modules also increased, where each usage of the transfer modules involves a plurality of cycles of pumping down and venting of the transfer modules. Even though the duration of pumping and venting cycles of the transfer modules are shorter compared to that of the processing chambers, the time consumed during these cycles reduces the overall throughput of the processed wafers, and consequently, reduces the throughput of the fabricated semiconductor devices.

The present disclosure provides example systems and methods for improving the throughput of semiconductor device manufacturing systems. In some embodiments, transfer chambers of transfer modules of the semiconductor device manufacturing systems are configured to dynamically modify the interior volumes of the transfer chambers to achieve faster pumping down and venting of the transfer chambers. In some embodiments, transfer chambers can include liners installed along their inner sidewalls. The liners can be configured to be inflatable with a gaseous medium during the pumping down and/or venting operations of the transfer module. The expansion of the volumes of the inflatable liners helps to reduce the interior volumes of the transfer chambers. As a result, the reduced volumes of the transfer chambers can be pumped down and vented faster than transfer chambers without the liners to reach the desired vacuum pressure and atmospheric pressure, respectively. In some embodiments, the time required for pumping down the transfer chambers with liners is reduced by about 5% to about 10%. In some embodiments, the time required for venting the transfer chambers with liners is reduced by about 5% to about 10%. In some embodiments, the liners can be configured to protect the robotic arms of the transfer modules from structural damages in the events of collisions with the interior of the transfer chambers during the wafer transfer operations.

FIG. 1A shows a plan view of a semiconductor device manufacturing system 100, according to some embodiments. Semiconductor device manufacturing system 100 can include processing modules 101A-101B, transfer modules 103A-103B, transfer tube 105, loading ports 107, and a control system 124.

Transfer tube 105 can be configured to provide a central transfer conduit to transfer wafers between loading ports 107 and transfer modules 103A-103B. In some embodiments, transfer tube 105 can include a robotic arm 113 and a wafer orientation stage 115. Robotic arm 113 can be configured to transfer the wafers between loading ports 107, wafer orientation stage 115, and transfer modules 103A-103B. In some embodiments, transfer tube 105 can be configured to be at atmospheric pressure or at a vacuum environment.

Each of loading ports 107 can accommodate a wafer storage device 108 (sometimes referred as front opening unified pod (FOUP)). Wafer storage devices 108 can be configured for temporarily storing a batch of wafers in a controlled environment during intervals between the different processes in processing modules 101A-101B. Each of wafer storage devices 108 can include a purging system (not shown) to reduce humidity and contamination from environment. The purging systems can include one or more gas inlet tubes (not shown) configured to supply purging gas into wafer storage devices 108. The purging systems can also include one or more outlets (not shown) configured to extract the purging gas from wafer storage devices 108.

One or more of the batch of wafers in wafer storage devices 108 can be transferred by robotic arm 113 to wafer orientation stage 115 prior to being transferred to transfer modules 103A and/or 103B and subsequently to respective processing modules 101A and/or 101B. Wafer orientation stage 115 can be configured to adjust an orientation of each wafer toward a direction in favor of a semiconductor manufacturing process to be performed on the wafer, where an outcome of the semiconductor manufacturing process (e.g. epitaxy) depends on the wafer crystallinity. Robotic arm 113 can be further configured to transfer the oriented wafers to transfer module 103A and/or 103B. In some embodiments, robotic arm 113 can be configured to transfer the wafers from wafer storage devices 108 to transfer module 103A and/or 103B.

Processing modules 101A and 101B can include processing chambers 102A-102B and gate valves 117A-117B, respectively. Even though two processing modules 101A-101B are shown here, system 100 can have less than or more than two processing modules similar to processing modules 101A-101B. Each of processing chambers 102A-102B can be configured to provide a high vacuum environment to conduct a plurality of semiconductor manufacturing processes on semiconductor wafers (not shown) that require a vacuum environment (e.g., a vacuum pressure below $10^{-4}$ torr) to preserve, for example, the desired mean-free-path of the reacting gases, plasma and/or electrons in processing chambers 102A-102B during operations.

In some embodiments, the plurality of semiconductor manufacturing processes can include deposition processes such as, for example, molecular beam epitaxy (MBE), chemical vapor deposition (CVD), plasma-enhanced chemical vapor deposition (PECVD), low-pressure chemical vapor deposition (LPCVD), electrochemical deposition (ECD), physical vapor deposition (PVD), atomic layer deposition (ALD), metal organic chemical vapor deposition (MOCVD), sputtering, thermal evaporation, e-beam evaporation, or other deposition processes; etching processes such as, for example, dry etching, reactive ion etching (RIE), inductively coupled plasma etching (ICP), or ion milling; thermal process such as, for example, rapid thermal annealing (RTA); microscopy such as, for example, scanning electron microscopy (SEM), and transmission electron microscopy (TEM); or any combination thereof.

Each of processing chambers 102A-102B can include a plurality of ports for installing auxiliary manufacturing apparatus or for coupling to other vacuum chamber(s). Ports of processing chambers 102A-102B can be sealed during operation with vacuum flanges equipped with knife edge or o-ring to ensure maintenance of vacuum pressure level of the processing chamber.

Transfer modules 103A-103B can include transfer chambers 112A-112B, robotic arms 111A-111B, wafer stations 114A-114B, and gate valves 119A-119B, respectively. Transfer chambers 112A-112B can be configured to enclose robotic arms 111A-111B, and wafer stations 114A-114B, respectively. Each of transfer modules 103A-103B can be coupled to respective processing modules 101A-101B with respective gate valves 117A-117B between them. Gate valves 117A-117B can be configured to isolate processing chambers 102A-102B from transfer chambers 112A-112B during wafer processing in processing chambers 102A-102B, respectively. Gate valves 117A-117B can be further configured to provide access between processing chambers 102A-102B and transfer chambers 112A-112B, respectively, during transfer of wafers between them. Transfer chambers 112A-112B can be configured to be under a vacuum pressure similar to that of processing chambers 102A-102B when gate valves 117A-117B are configured to provide access between processing chambers 102A-102B and transfer chambers 112A-112B, respectively, so that processing chambers 102A-102B can avoid venting to save time. In some embodiments, gate valves 117A-117B can be configured to provide access between processing chambers 102A-102B and transfer chambers 112A-112B, respectively, in response to control signals (not shown) indicating that transfer chambers 112A-112B are under a vacuum pressure similar to that of processing chambers 102A-102B and that gate valves 119A-119B are closed.

Even though one transfer module (e.g., transfer modules 103A-103B) coupled to each processing modules 101A-101B is shown here, system 100 can have a common transfer module that is shared between processing modules 101A-101B or between N number of processing modules similar to processing modules 101A-101B, where N can be any integer. The common transfer module can be similar to transfer modules 103A-103B, but with N number of gate valves similar to gate valves 117A-117B to provide access between the common transfer module and N number of processing modules, respectively.

In some embodiments, robotic arms 111A-111B can be configured to transfer one or more wafers (not shown) between wafer stations 114A-114B and processing chambers 102A-102B, respectively. Wafer stations 114A-114B can be temporary storage stations for wafers during transfer between processing chambers 102A-102B and transfer chambers 112A-112B, between transfer chambers 112A-112B and transfer tube 105, and/or between transfer chambers 112A-112B and wafer storage devices 108 in loading ports 107, respectively. Wafer stations 114A-114B can be configured to hold one or more wafers waiting to be transferred to processing chambers 102A-102B, transfer chambers 112A-112B, transfer tube 105, and/or wafer storage devices 108, respectively.

Each of transfer modules 103A-103B can be coupled to transfer tube 105 with respective gate valves 119A-119B between them. Gate valves 119A-119B can be configured to isolate transfer chambers 112A-112B from transfer tube 105 during wafer transfer between processing chambers 102A-102B and transfer chambers, respectively, since transfer tube 105 is typically under atmospheric pressure. Gate valves 119A-119B can be further configured to provide access between transfer chambers 112A-112B and transfer tube 105, respectively, during transfer of wafers between them. Transfer chambers 112A-112B can be configured to be under atmospheric pressure when gate valves 119A-119B are configured to provide access between transfer chambers 112A-112B and transfer tube 105, respectively.

Transfer modules 103A-103B can be configured to provide a pressure level within respective transfer chambers 112A-112B that is similar to the pressure level within transfer tube 105 or respective processing chambers 102A-102B based on where the wafers are scheduled to be transferred. Before transferring the wafers from transfer tube 105 to transfer chambers 112A and/or 112B, transfer modules 103A and/or 103B can be configured to vent respective transfer chambers 112A and/or 112B with an inert and/or purified gas (e.g. nitrogen or argon) to achieve the pressure level as in transfer tube 105. In response to the pressure levels within transfer chambers 112A and/or 112B and transfer tube 105 being substantially equal to each other, respective gate valves 119A and/or 119B can be configured to open for allowing robotic arm 113 to transfer the wafers into respective transfer chambers 112A and/or 112B.

Transfer modules 103A and/or 103B can be further configured to pump down respective transfer chambers 112A and/or 112B with one or more vacuum pumps or other suitable means (not shown) to achieve a vacuum pressure similar to that of processing chambers 102A and/or 102B, respectively. In response to the vacuum pressure within processing chambers 102A and/or 102B and transfer chambers 112A and/or 112B, being substantially equal to each other, respectively, gate valves 117A and/or 117B can be configured to open to allow robotic arms 111A and/or 111B to transfer the wafers into processing chambers 102A and/or 102B, respectively.

Transfer modules 103A and/or 103B can also be configured to vent transfer chambers 112A and/or 112B, respectively, with an inert and/or purified gas (e.g. nitrogen or argon) to achieve a pressure level (e.g. atmosphere) that is substantially equal to that of transfer tube 105. In response to the pressure levels within transfer chambers 112A and/or 112B and transfer tube 105 being substantially equal to each other, respective gate valves 119A and/or 119B can be opened to allow the transfer of wafers to transfer tube 105, and subsequently, to one or more of the wafer storage devices 108 in loading ports 107.

In some embodiments, transfer modules 103A-103B can further include liners 121A-121B, gas supply systems 109A-109B, gas extraction systems 110A-110B, gas inlet ports 120A-120B, and gas outlet ports 122A-122B, respectively. Liners 121A-121B can be placed on one or more inner surfaces of transfer chambers 112A-112B, respectively. In some embodiments, liners 121A-121B can be placed on one or more inner side surfaces, inner upper surfaces (not shown), and/or inner bottom surfaces (not shown) of transfer chambers 112A-112B, such that liners 121A-121B do not block wafer stations 114A-114B, robotic arms 111A-11B, gate valves 117A-117B, gate valves 119A-119B, and/or other elements or openings (not shown) of transfer modules 103A-103B, respectively. Liners 121A-121B can be placed on side surfaces of transfer chambers 112A-112B having gate valves 117A-117B, gate valves 119A-119B, gas inlet ports 120A-120B, and gas outlet ports 122A-122B, respectively, such that liners 121A-121B do not block these gate valves and ports. In some embodiments, liners 121A-121B can be placed on side surfaces of transfer chambers 112A-112B having gate valves 117A-117B and gate valves 119A-

119B without blocking the movement of robotic arms 111A-111B and 113, respectively, during their wafer transfer operations. In some embodiments, liners 121A-121B can be placed on side surfaces of transfer chambers 112A-112B having gas inlet ports 120A-120B, and gas outlet ports 122A-122B without blocking the supply and extraction of gas during the pumping down and venting operations of transfer modules 103A-103B, respectively.

In some embodiments, liners 121A-121B can be coupled to one or more inner side surfaces, inner upper surfaces (not shown), and/or inner bottom surfaces (not shown) of transfer chambers 112A-112B, respectively with adhesive (e.g., tape, glues, polymeric compositions such as silicones, epoxies, or resins), mechanical parts (e.g., screws or clamps), other suitable coupling elements, or a combination thereof. The material of liners 121A-121B can include nylon, rubber, plastic, synthetic, other suitable flexible material(s), or a combination thereof.

Liners 121A-121B can be configured to reduce volume of respective transfer chambers 112A-112B during pumping down and/or venting operations of respective transfer modules 103A-103B. In some embodiments, liners 121A-121B can be configured to be inflated with air or other suitable gas (e.g. nitrogen, argon, or an inert gas) to reduce volume of respective transfer chambers 112A-112B during the pumping down and/or venting operations of respective transfer modules 103A-103B. In some embodiments, liners 121A-121B can be configured to be deflated during or after the venting operations of respective transfer modules 103A-103B. Reducing the volume of transfer chambers 112A-112B during their pumping down and/or venting operations helps to reduce the time period required to pump down and/or vent transfer chambers 112A-112B. Such reduction in the pumping down and/or venting periods helps to reduce the wafer transfer time between transfer chambers 112A-112B and processing chambers 102A-102B, respectively and/or between transfer chambers 112A-112B and transfer tube 105.

In some embodiments, the volume of each of transfer chambers 112A-112B can be reduced by about 5% to about 10% compared to transfer chambers without liners similar to liners 121A-121B. In some embodiments, the pumping down period of transfer chambers 112A-112B can be reduced by about 5% to about 10% compared to transfer chambers without liners similar to liners 121A-121B. In some embodiments, the venting period of transfer chambers 112A-112B can be reduced by about 5% to about 10% compared to transfer chambers without liners similar to liners 121A-121B. In some embodiments, the wafer transfer time between transfer chambers 112A-112B and processing chambers 102A-102B, respectively can be reduced by about 5% to about 10% compared to transfer chambers without liners similar to liners 121A-121B.

The inflation and deflation of liners 121A-121B can be carried out by gas supply systems and gas extraction systems 109A-109B and 110A-110B through gas inlet ports 120A-120B and gas outlet ports 122A-122B, respectively. Gas inlet ports 120A-120B and/or gas outlet ports 122A-122B can be openings through sidewalls of respective transfer chambers 112A-112B. In some embodiments, gas supply systems 109A-109B and gas extraction systems 110A-110B may be a combined system, respectively, and not separate system as illustrated in FIG. 1A. In some embodiments, each of transfer modules 103A-103B can have a common gas system (not shown) instead of gas supply systems and gas extraction systems 109A-109B and 110A-110B for supplying and extracting gas to and from respective liners 121A-121B through a common gas inlet/outlet port (not shown) instead of through gas inlet ports 120A-120B and gas outlet ports 122A-122B, respectively. In some embodiments, each of liners 121A-121B can be a single continuous liner as illustrated in FIG. 1A or can include two or more segments of liners (not shown). Each segment of liners can have its own gas inlet and outlet ports and gas supply and extraction systems for its inflation and deflation operations similar to liners 121A-121B. The discussion of liners 121A and/or 121B herein applies to the segments of liners.

Liners 121A-121B can be coupled to gas supply systems 109A-109B and gas extraction systems 110A-110B through gas inlet ports 120A-120B and gas outlet ports 122A-122B, respectively. The black dashed lines from gas supply systems 109A-109B to gas inlet ports 120A-120B, respectively, illustrate the gas supply lines and from gas outlet ports 122A-122B to gas extraction systems 110A-110B, respectively, illustrate the gas extraction lines. In some embodiments, gas supply lines and/or gas extraction lines can be coupled to liners 121A-121B through gas inlet ports 120A-120B and/or gas outlet ports 122-122B, respectively, with mechanical couplings (illustrated in FIG. 1B) that can be configured to preserve vacuum seal in respective transfer chambers 112A-112B.

Figure 1B:
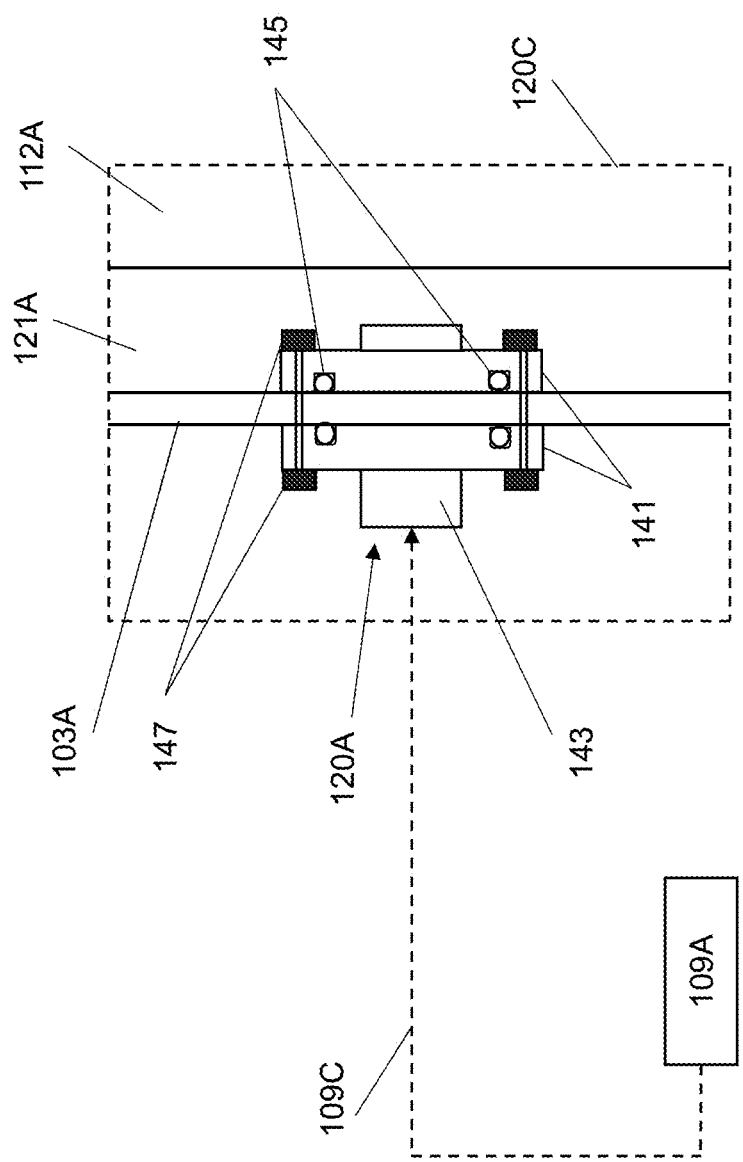
FIG. 1B is an enlarged view of a section of FIG. 1A, in accordance with some embodiments.

FIG. 1B illustrates an enlarged view of a portion 120C of transfer module 103A where liner 121A is coupled to a gas supply line 109C of gas supply system 109A through gas inlet port 120A. Liner 121A can be coupled to gas supply line 109C with a mechanical coupling that includes a pair of flanges 141, an interface fitting 143, O-rings 145, and screws 147. In some embodiments, one flange of the pair of flanges 141, at least one of O-rings 145, and at least one of screws 147 of the mechanical coupling can be located within liner 121A. In some embodiments, interface-fitting 143 can be positioned within gas inlet port 120A with a first portion of interface fitting 143 extending into liner 121A and a second portion of interface-fitting 143 extending out of transfer module 103A. The mechanical coupling can couple liner 121A to gas supply line 109C in such a manner that vacuum seal is preserved when transfer chamber 112A operates under vacuum.

Referring back to FIG. 1A, in some embodiments, liners 121A and/or 121B can be in a deflated state during transfer of wafers between transfer tube 105 and respective transfer chambers 112A and/or 112B. In some embodiments, liners 121A and/or 121B can be inflated by air or inert gas supplied by gas supply systems 109A and/or 109B through gas inlet ports 120A and/or 120B during transfer of wafers from transfer tube 105 to transfer chambers 112A and/or 112B, respectively. The inflation can be performed to prepare transfer chambers 112A and/or 112B for the pumping down operation prior to transferring the wafers into respective processing chambers 102A and/or 102B. Reducing the volume of transfer chambers 112A and/or 112B with respective inflated liners 121A and/or 121B can speed up the subsequent pumping down operation. In some embodiments, liners 121A and/or 121B can be inflated by air or inert gas supplied by gas supply systems 109A and/or 109B through gas inlet ports 120a and/or 120B after receiving the wafers from transfer tube 105 and during the pumping down of transfer chambers 112A and/or 112B to vacuum pressure.

In some embodiments, liners 121A and/or 121B can remain in the inflated state if transfer chambers 112A and/or 112B remain under vacuum until the wafers are transferred back into transfer chambers 112A and/or 112B after being processed in processing chambers 102A and/or 102B, respectively. Subsequent to this transfer back of wafers into transfer chambers 112A and/or 112B, transfer chambers 112A and/or 112B can be vented to prepare these chambers for transferring the wafers back into transfer tube 105 at atmospheric pressure. During this venting operation, liners 121A and/or 121B can be deflated by extracting gas from liners 121A and/or 121B through gas outlet ports 122A and/or 122B using gas extraction systems 110A and/or 110B, respectively. In some embodiments, liners 121A and/or 121B can remain inflated during this venting operation and also during transfer of wafers from transfer chambers 112A and/or 112B to prevent structural damages to robotic arms 111A and/or 111B in the events of collisions with the interior of transfer chambers 112A and/or 112B, respectively.

Control system 124 can be coupled to gas supply systems 109A-109B and gas extraction systems 110A-110B. In some embodiments, control system 124 can be configured to control the operations of gas supply systems 109A-109B and gas extraction systems 110A-110B, and thus control the inflation and deflation of liners 121A-121B, respectively. In some embodiments, control system 124 can activate and/or deactivate gas supply systems 109A-109B and gas extraction systems 110A-110B based on control signals (not shown). Control system 124 can be configured to prevent simultaneous activation of gas supply systems 109A-109B and gas extraction systems 110A-110B. The activation and/or deactivation of gas supply systems 109A-109B and gas extraction systems 110A-110B can include controlling the gas supply to gas inlet ports 120A-120B and the operation of extraction pumps of gas extraction systems 110A-110B, respectively. In some embodiments, to activate and deactivate gas supply systems 109A-109B, control system 124 can provide activation and deactivation signals that open and close gas supply valves of gas supply systems 109A-109B to supply and block, respectively, the flow of gas to gas inlet ports 120A-120B. In some embodiments, to activate and deactivate gas extraction systems 110A-110B, control system 124 can provide activation and deactivation signals that activate and deactivate the extraction pumps, and open and close valves of gas extraction systems 110A-110B to allow and block, respectively, the flow of gas out of liners 121A-121B through gas outlet ports 122A-122B, respectively.

The operations of gas supply systems 109A-109B and gas extraction systems 110A-110B can be controlled by control system 124 based on one or more signals received by control system 124 that indicate the pressure levels of transfer chambers 112A-112B, the gas pressure within liners 121A-121B, the position of gate valves 117A-117B and 119A-119B, the operations of pumping and/or venting systems of transfer modules 103A-103B for pumping and/or venting transfer chambers 112A-112B, and/or the presence of wafers in transfer chambers 112A-112B.

In some embodiments, control system 124 can provide activation signals to gas supply systems 109A-109B for inflating liners 121A and/or 121B in response to receiving sensor signals that indicate the presence of wafers within transfer chambers 112A-112B, the closed position of gate valves 117A-117B and 119A-119B, and/or the activation of pumping systems of transfer modules 103A-103B for pumping down of respective transfer chambers 112A-112B. Similarly, activation signals can be provided by control system 124 to gas extraction systems 110A-110B for deflating liners 121A and/or 121B in response to receiving sensor signals that indicate the absence of wafers from within transfer chambers 112A-112B, closed position of gate valves 117A-117B and 119A-119B, and/or the activation of venting systems of transfer modules 103A-103B for venting of respective transfer chambers 112A-112B.

In some embodiments, deactivation signals can be provided by control system 124 to gas supply systems 109A-109B and gas extraction systems 110A-110B in response to receiving a sensor signal indicating that the gas pressure within liners 121A-121B is above and below a desired value, respectively. In some embodiments, deactivation signals can be provided by control system 124 to gas supply systems 109A-109B and gas extraction systems 110A-110B based on the duration of gas supplied to and gas extracted from liners 121A-121B, respectively.

Figure 2:
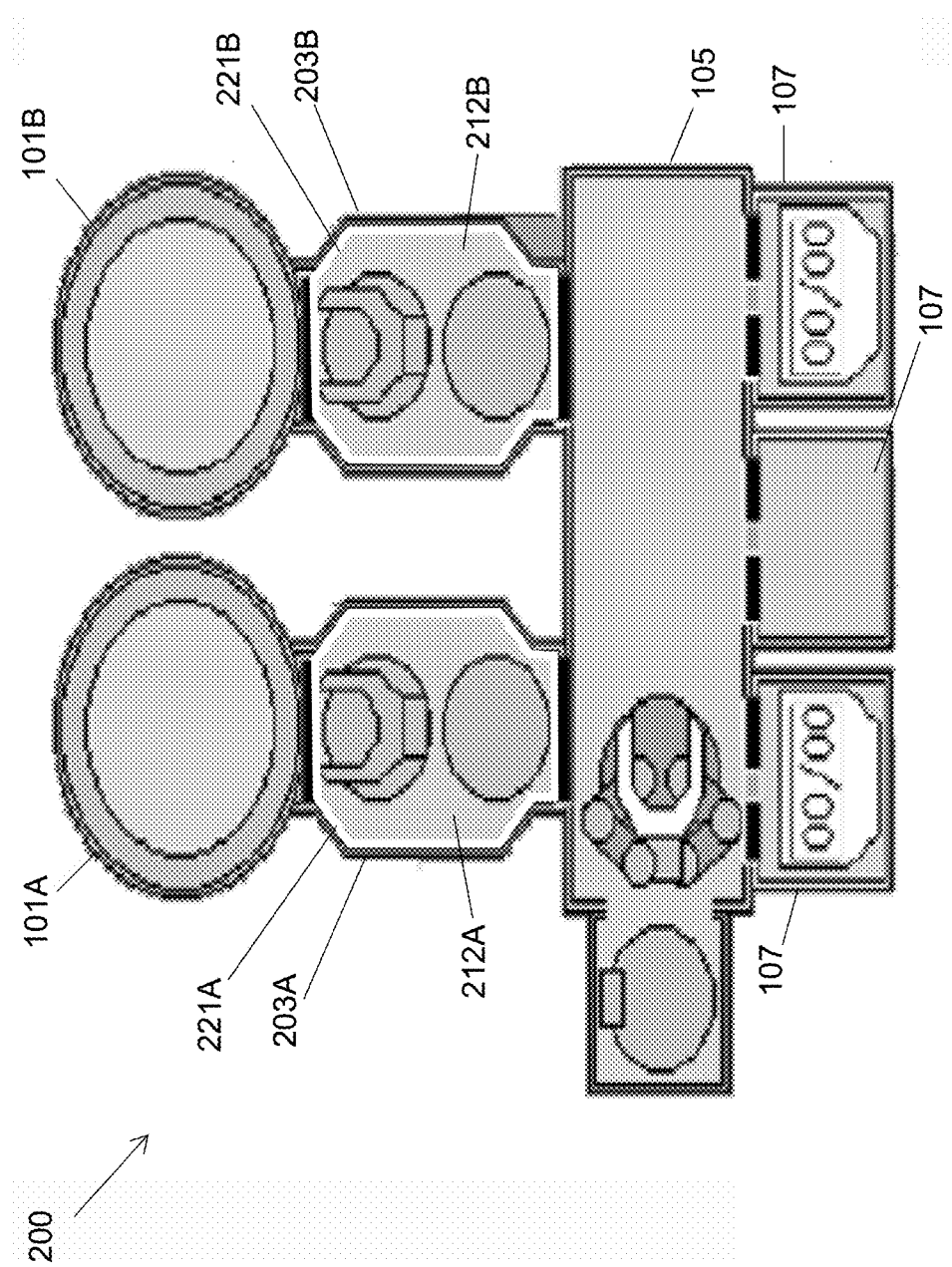
FIG. 2 is a plan view of a semiconductor device manufacturing system, in accordance with some embodiments.

FIG. 2 shows a plan view of a semiconductor wafer manufacturing system 200, according to some embodiments. The discussion of semiconductor wafer manufacturing system 100 applies to semiconductor wafer manufacturing system 200 unless mentioned otherwise. Semiconductor device manufacturing system 200 can include processing modules 101A-101B, transfer modules 203A-203B, transfer tube 105, and loading ports 107. Transfer modules 203A-203B can include transfer chambers 212A-212B, respectively. The discussion of elements with the same annotations in FIGS. 1A-1B and 2 applies to each other unless mentioned otherwise.

The discussion of transfer modules 103A-103B and transfer chambers 112A-112B applies to transfer modules 203A-203B and transfer chambers 212A-212B unless mentioned otherwise. Each of transfer chambers 212A-212B can include liners 221A-221B, respectively. Each of liners 221A-221B can be a permanently inflated flexible element. As such, unlike transfer chambers 112A-112B, transfer chambers 212A-212B does not have gas inlet ports 120A-120B and gas outlet ports 122A-122B for the inflation and deflation of liners 221A-221B, respectively. Liners 221A-221B can be inflated with air, any gas species such as nitrogen, or flakes of soft material prior to installing them within transfer chambers 212A-212B, respectively. Composition of liners 221A-221B can be similar to that of liners 121A-121B. In some embodiments, liners 221A-221B can include plastic, synthetic or any other suitable material. The placement of liners 221A-221B inside transfer chambers 212A-212B can be similar to that of liners 121A-121B unless mentioned otherwise. In some embodiments, liners 221A-221B can be coupled to one or more inner surfaces of transfer chambers 212-212B via adhesive, tapes, or mechanical parts such as clamp. Similar to liners 121A-121B, inflated liners 221A-221B can reduce interior volume of transfer chambers 212A-212B, and thus can reduce the pump downing and/or venting time of transfer chambers 212A-212B during the wafer transfer operations. The wafer transfer operations of system 200 can be similar to that of system 100 described above with reference to FIG. 1A.

Figure 3A:
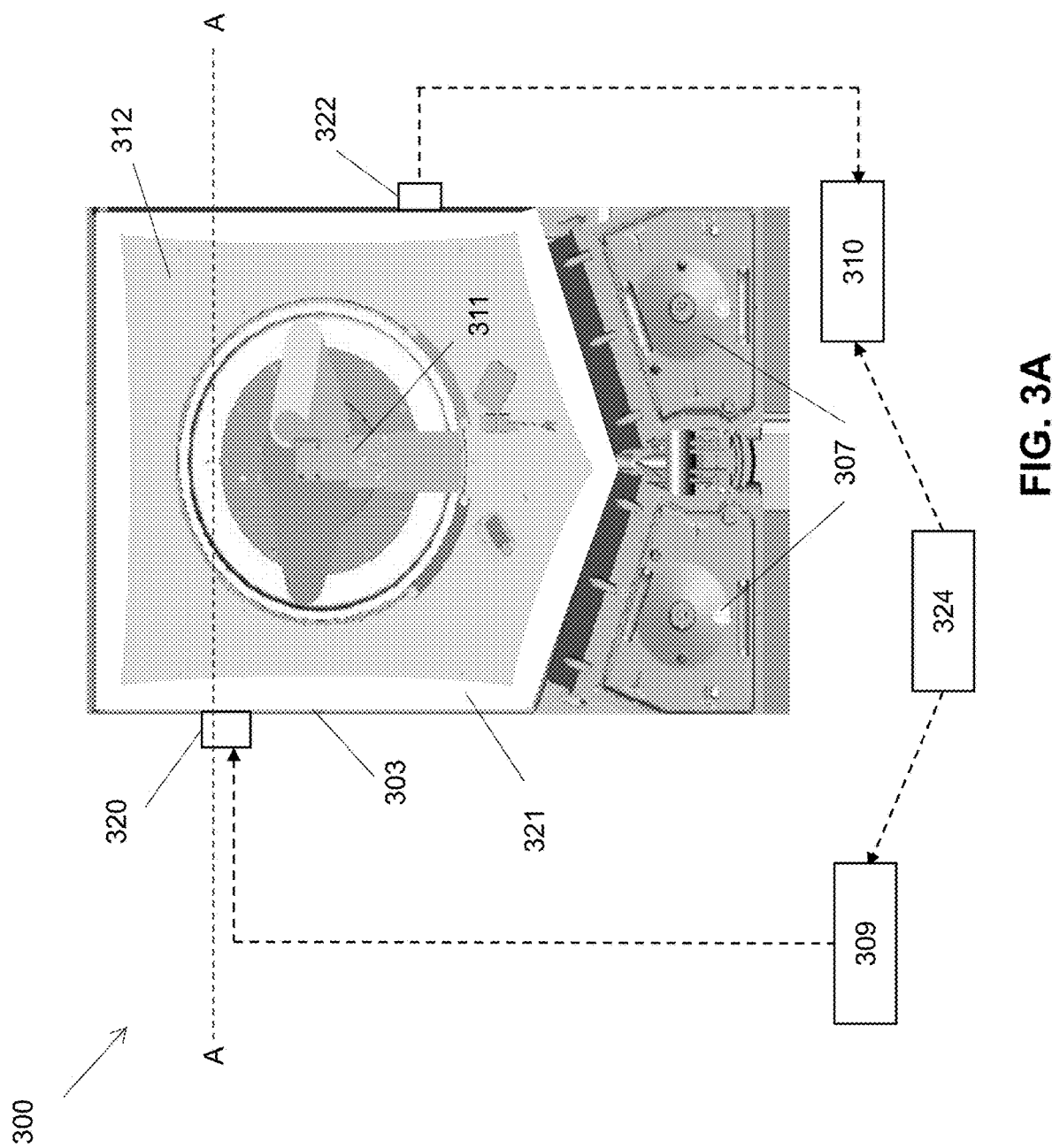
FIG. 3A is a plan view of a semiconductor device manufacturing system, in accordance with some embodiments.
Figure 3B:
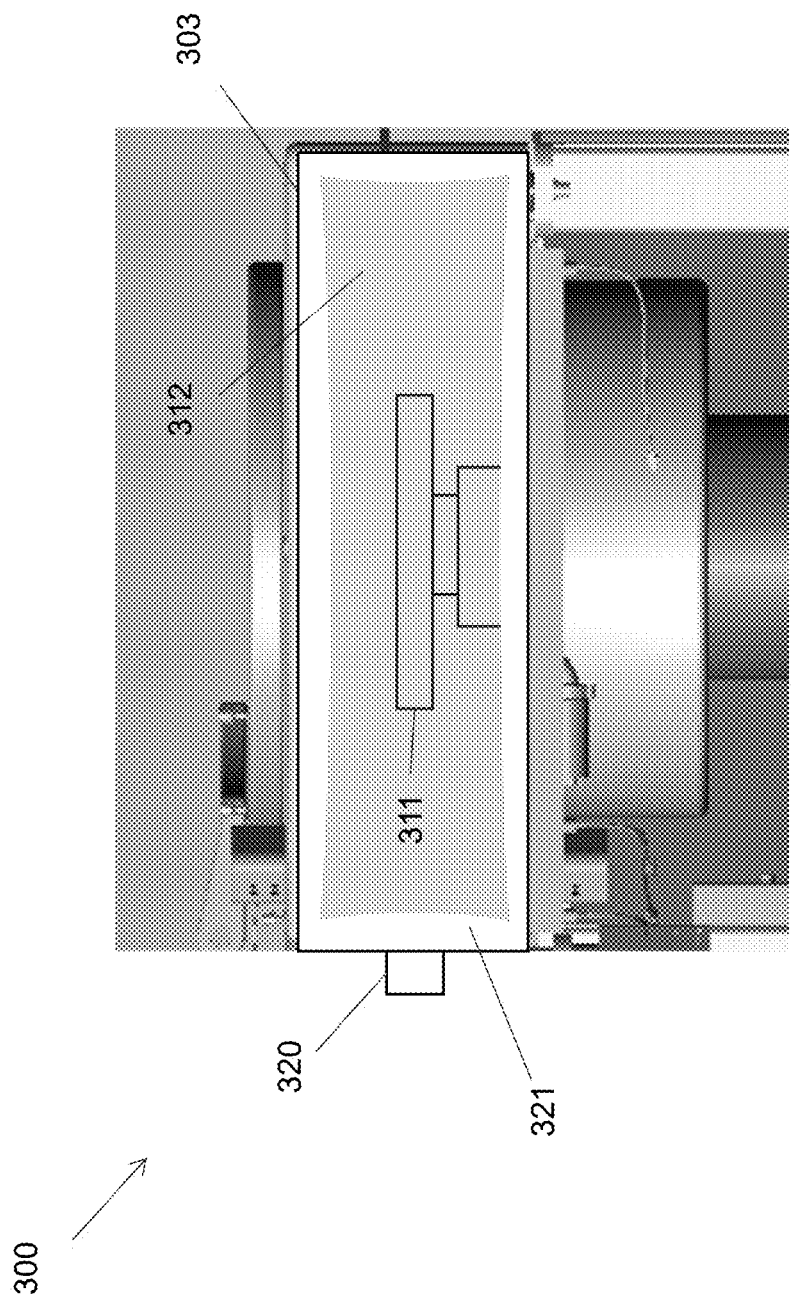
FIG. 3B is a cross-sectional view of a semiconductor device manufacturing system, in accordance with some embodiments.

FIG. 3A shows a plan view of a semiconductor wafer manufacturing system 300 and FIG. 3B shows a cross-sectional view of system 300 along line A-A of FIG. 3A, according to some embodiments. The discussion of semiconductor wafer manufacturing system 100 applies to semiconductor wafer manufacturing system 300 unless mentioned otherwise. Semiconductor wafer manufacturing system 300 can include a transfer module 303 and loading ports 307. The discussion of transfer module 103A and loading ports 107 applies to transfer module 303 and loading ports 307, respectively, unless mentioned otherwise.

Transfer module 303 can include transfer chamber 312 and robotic arm 311. The discussion of transfer chamber 112A and robotic arm 111A applies to transfer chamber 312 and robotic arm 311 unless mentioned otherwise. Transfer module 303 can be coupled to loading ports 307 and one or more processing modules (not shown) similar to processing module 101A. Transfer module 303 can be configured to provide a pressure level within transfer chamber 312 that is similar to the pressure level within loading ports 307 or processing chambers of the one or more processing modules (not shown) based on where the wafers are scheduled to be transferred.

Transfer module 303 can be configured to pump down transfer chambers 312 with one or more vacuum pumps or other suitable means (not shown) to achieve a vacuum pressure similar to that of processing chambers of the one or more processing modules (not shown). In response to the vacuum pressure within the processing chambers and transfer chamber 312 being substantially equal to each other, robotic arm 311 can transfer the wafers into the processing chambers. Transfer module 303 can also be configured to vent transfer chamber 312 with an inert and/or purified gas (e.g. nitrogen or argon) to achieve a pressure level (e.g. atmosphere) that is substantially equal to that of one of loading ports 307. In response to the pressure levels within transfer chamber 312 and one of loading ports 307 being substantially equal to each other, robotic arm 311 can transfer the wafers to one or more of the wafer storage devices in one of loading ports 307.

In some embodiments, transfer module 303 can further include a liner 321, a gas supply system 309, a gas extraction system 310, and a control unit 324. The discussion of liner 121A, gas supply system 109A, gas extraction system 110A, and control unit 124 applies to liner 321, gas supply system 309, gas extraction system 310, and control unit 324 unless mentioned otherwise. For example, the placement of liner 321 within transfer chamber 312 can be similar to that of liner 121A. The placement of liner 321 along the inner surfaces of transfer chamber 312 is further illustrated in FIG. 3B, which shows a cross-sectional view of transfer module 303 along line A-A of FIG. 3A.

Similar to liner 121A, liner 321 can be coupled to gas supply systems 309 and gas extraction system 310 through gas inlet port 320 and gas outlet port 322, respectively, with mechanical couplings (not shown). The discussion of gas inlet port 120A and gas outlet port 122A applies to gas inlet port 320 and gas outlet port 322, respectively. Liner 321 can be configured to reduce volume of transfer chamber 312 during pumping down and/or venting operations of transfer module 303. In some embodiments, liner 321 can be configured to be inflated with air or other suitable gas (e.g. nitrogen, argon, or an inert gas) to reduce volume of transfer chamber 312 during the pumping down and/or venting operations of transfer module 303. In some embodiments, liner 321 can be configured to be deflated during or after the venting operations of transfer module 303. Reducing the volume of transfer chamber 312 during the pumping down and/or venting operations helps to reduce the time period required to pump down and/or vent transfer chamber 312. Such reduction in the pumping down and/or venting periods helps to reduce the wafer transfer time between transfer chamber 312 and processing chambers and/or between transfer chamber 312 and loading ports 307.

In some embodiments, liner 321 can be a permanently inflated liner similar to liner 221A. In such embodiments, transfer module 303 may not have gas inlet port 320, gas outlet port 322, gas supply system 309, gas extraction system 310 and control system 324.

Figure 4:
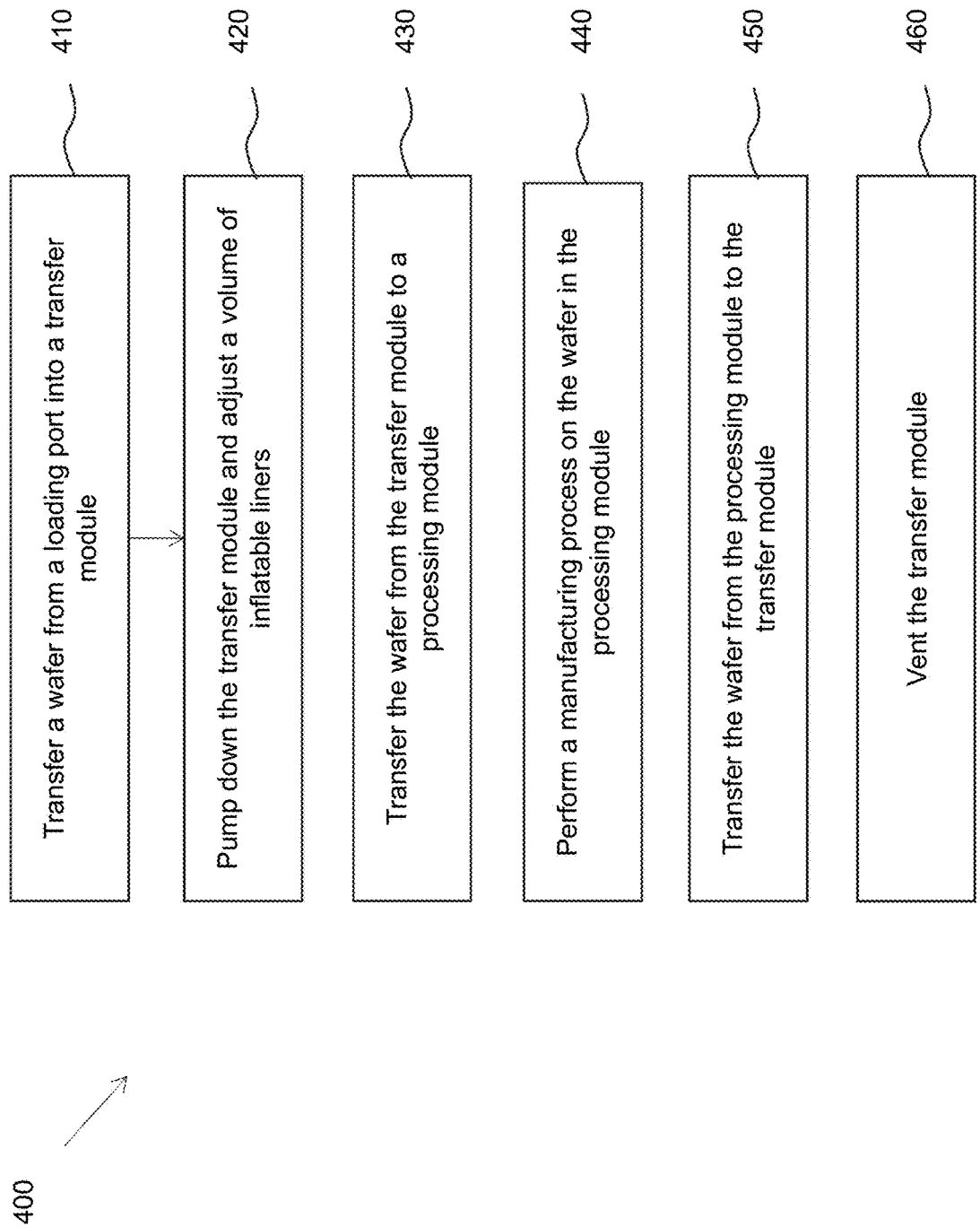
FIG. 4 is a flow chart of a method for operating a semiconductor device manufacturing system, in accordance with some embodiments.

FIG. 4 is an example method 400 for operating a semiconductor wafer manufacturing system as described with reference to FIGS. 1A-1B, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 4. In some implementations, one or more other operations may be performed in addition to or in place of the presently described operations. For illustrative purposes, method 400 is described with reference to the embodiments of FIGS. 1A-1B. However, method 400 is not limited to these embodiments.

In operation 410, a semiconductor wafer is transferred from a loading port to a transfer module of the semiconductor wafer manufacturing system. For example, as described with reference to FIG. 1A, a wafer can be transferred from loading port 107 to transfer chamber 112A of transfer module 103A. This wafer transfer operation can include transferring the wafer from loading port 107 to transfer tube 105 and from transfer tube 105 to transfer chamber 112A. The wafer transfer operation between loading port 107 to transfer tube 105 can include transferring the wafer from loading port 107 by robotic arm 113 to wafer orientation stage 115. The wafer transfer operation between transfer tube 105 and transfer chamber 112A can include venting transfer chamber 112A to atmospheric pressure (e.g., 760 mtorr) and transferring the oriented wafer from wafer orientation stage 115 by robotic arm 113 to transfer chamber 112A. In some embodiments, the wafer can be placed on wafer station 114A.

In referring to FIG. 4, in operation 420, the transfer module is pumped down and a volume of a liner of the transfer module is adjusted. For example, as described with reference to FIG. 1A, transfer chamber 112A can be pumped down to a vacuum pressure level (e.g., between about 10 mtorr to about 50 mtorr) and liner 121A can be inflated to reduce volume of transfer chamber 112A for faster pumping down of transfer chamber 112A. The inflating operation can be carried out by gas supply system 109A through gas inlet port 120A prior to or simultaneously with the pumping down operation. Liner 121A can be inflated with air or other suitable gas (e.g. nitrogen, argon, or an inert gas). In some embodiments, liner 121A can be inflated at a rate that is faster than a rate at which transfer chamber 112A is pumped down.

In referring to FIG. 4, in operation 430, the wafers are transferred from the transfer module to a processing module. For example, as described with reference to FIG. 1A, the wafer can be transferred from transfer chamber 112A to processing chamber 102A of processing module 101A. This transfer operation can include adjusting the pressure in processing chamber 102A to be substantially similar to the pressure in transfer chamber 112A followed by the opening of gate valve 117A, the transfer of the wafer from transfer chamber 112A to processing chamber 102A using robotic arm 111A, closing of gate valve 117A, and pumping down the processing chamber 102A to a vacuum pressure level (e.g., between about 1 mtorr to about 10 mtorr) suitable for processing the wafer. In some embodiments, the adjusting the pressure in processing chamber 102A can include venting processing chamber 102A to increase the chamber pressure from about 10 mtorr to about 50 mtorr.

In referring to FIG. 4, in operation 440, one or more semiconductor manufacturing processes are performed on the wafer in the processing module. For example, as described with reference to FIG. 1A, one or more semiconductor manufacturing processes can be performed on the wafer in processing chamber 102A. The one or more semiconductor manufacturing procedures can include deposition processes such as MBE, CVD, PECVD, LPCVD, ECD, PVD, ALD, MOCVD, sputtering, thermal evaporation, e-beam evaporation, or other deposition processes; etching processes such as dry etching, RIE, ICP, and ion milling; thermal process such as RTA; and microscopy such as SEM, and TEM; or any combination thereof. In some embodiments, a high vacuum (e.g., between about 1 mtorr to about 10 mtorr) is preserved within processing chamber 102A during the one or more manufacturing processes.

In referring to FIG. 4, in operation 450, the processed wafer is transferred from the processing module to the transfer module. For example, as described with reference to FIG. 1A, the processed wafer can be transferred from processing chamber 102A to transfer chamber 112A. This transfer operation can include adjusting the pressure in processing chamber 102A to be substantially similar to the pressure in transfer chamber 112A followed by the opening of gate valve 117A, the transfer of the wafer from processing chamber 102A to transfer chamber 112A using robotic arm 111A, closing of gate valve 117A, and pumping down the processing chamber 102A to a vacuum pressure level (e.g., between about 1 mtorr to about 10 mtorr). In some embodiments, the adjusting the pressure in processing chamber 102A can include venting processing chamber 102A to increase the chamber pressure from about 10 mtorr to about 50 mtorr.

In some embodiments, this transfer operation 450 can also include measuring pressure of transfer chamber 112A prior to the opening of gate valve 117A and performing operation similar to operation 420 in response to pressure of transfer chamber 112A being different from the adjusted pressure of processing chamber 102A.

In referring to FIG. 4, in operation 460, the transfer module is vented. For example, as described with reference to FIG. 1A, transfer chamber 112A can be vented to atmospheric pressure and the processed wafer can be transferred back to one of loading ports 107 using robotic arm 113. In some embodiments, liner 121A can be deflated during or after venting of transfer chamber 112A. Deflating liner 121A can include extracting gas from liner 121A through gas outlet port 122A using gas extraction system 110A. In some embodiments, liner 121A can remain inflated during or after venting of transfer chamber 112A.

The present disclosure provides example systems and methods for improving the throughput of semiconductor device manufacturing systems. In some embodiments, transfer chambers of transfer modules of the semiconductor device manufacturing systems are configured to dynamically modify the interior volumes of the transfer chambers (e.g., transfer chambers 112A, 112B, and/or 312) to achieve faster pumping down and venting of the transfer chambers. In some embodiments, transfer chambers can include liners (e.g., liners 121A, 121B, 221A, 221B, and/or 321) installed along their inner sidewalls. The liners can be configured to be inflatable with a gaseous medium during the pumping down and/or venting operations of the transfer module. The expansion of the volumes of the inflatable liners helps to reduce the interior volumes of the transfer chambers. As a result, the reduced volumes of the transfer chambers can be pumped down and vented faster than transfer chambers without the liners to reach the desired vacuum pressure and atmospheric pressure, respectively. In some embodiments, the time required for pumping down the transfer chambers with liners is reduced by about 5% to about 10%. In some embodiments, the time required for venting the transfer chambers with liners is reduced by about 5% to about 10%.

In some embodiments, the liners can be configured to protect the robotic arms of the transfer modules from structural damages in the events of collisions with the interior of the transfer chambers during the wafer transfer operations.

In some embodiments, a semiconductor device manufacturing system includes a processing module and a transfer module. The processing module includes a processing chamber that is configured to process a semiconductor wafer and a gate valve that is configured to provide access to the processing chamber. The transfer module includes a transfer chamber that is coupled to the processing chamber and a liner that is coupled to an inner surface of the transfer chamber. The liner is configured to reduce a volume of the transfer chamber prior to or during a transfer chamber pressure adjustment operation of the transfer module.

In some embodiments, a system includes a processing module and a transfer module. The processing module includes a processing chamber that is configured to process a semiconductor wafer. The transfer module includes a transfer chamber that is coupled to the processing chamber and an inflated liner that is coupled to an inner side surface of the transfer chamber.

In some embodiments, a method of operating a semiconductor device manufacturing system includes transferring a semiconductor wafer into a transfer chamber of a transfer module, inflating a liner coupled to an inner surface of the transfer chamber, pumping down the transfer chamber to a vacuum pressure level, and transferring the semiconductor wafer from the transfer chamber to a processing chamber of a processing module.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device manufacturing system, comprising:
a processing module comprising:
a processing chamber configured to process a substrate, and
a gate valve configured to provide access to the processing chamber; and
a transfer module comprising:
a transfer chamber coupled to the processing chamber and configured to receive the substrate and transfer the received substrate to the processing module; and
a liner coupled to an inner surface of the transfer chamber and configured to reduce a volume of the transfer chamber while being separated from the substrate.

2. The semiconductor device manufacturing system of claim 1, wherein the liner is coupled to a side surface or a bottom surface of the transfer chamber.

3. The semiconductor device manufacturing system of claim 1, wherein the liner is configured to be inflated prior to a pressure adjustment operation of the transfer chamber.

4. The semiconductor device manufacturing system of claim 1, wherein the liner is configured to be inflated prior to a pumping down operation of the transfer module.

5. The semiconductor device manufacturing system of claim 4, wherein the liner is configured to be inflated at a first rate and the transfer chamber is configured to be pumped down at a second rate that is slower than the first rate.

6. The semiconductor device manufacturing system of claim 1, wherein the liner is configured to be deflated during a venting operation of the transfer module.

7. The semiconductor device manufacturing system of claim 1, wherein the liner is configured to be inflated with a gas or flakes of soft material prior to or during the transfer chamber pressure adjustment operation.

8. The semiconductor device manufacturing system of claim 1, wherein the liner comprises a flexible material comprising nylon, rubber, plastic, a synthetic material, or a combination thereof.

9. The semiconductor device manufacturing system of claim 1, wherein the transfer module further comprises a gas inlet port and a gas outlet port.

10. The semiconductor device manufacturing system of claim 9, wherein the transfer module further comprises:
a gas supply system that is coupled to the liner through the gas inlet port; and
a gas extraction system that is coupled to the liner through the gas outlet port.

11. The semiconductor device manufacturing system of claim 10, wherein the gas supply system is configured to supply a gas to inflate the liner and the gas extraction system is configured to extract the gas from the liner.

12. The semiconductor device manufacturing system of claim 10, wherein the gas supply system is configured to inflate the liner based on a control signal that indicates activation of a pumping system of the transfer module for pumping down of the transfer chamber.

13. The semiconductor device manufacturing system of claim 10, wherein the liner is coupled to the gas supply system with a mechanical coupling that comprises a pair of flanges and an interface fitting;
wherein a flange of the pair of flanges is located within the liner; and
wherein a first portion of the interface fitting extends into the liner and a second portion of the interface fitting extends out of the transfer module.

14. A system, comprising:
a processing module comprising a processing chamber configured to process a substrate; and
a transfer module configured to transfer the substrate to the processing module, comprising:
a transfer chamber coupled to the processing chamber; and
a liner coupled to an inner side surface of the transfer chamber and configured to reduce a volume of the transfer chamber while being separated from the substrate.

15. The system of claim 14, wherein the liner comprises a plurality of segments of inflated liners.

16. The system of claim 14, wherein the liner is coupled to an inner bottom surface of the transfer chamber.

17. The system of claim 14, wherein the liner comprises a gas or flakes of soft material.

18. A method of operating a semiconductor device manufacturing system, comprising:
transferring a substrate into a transfer chamber of a transfer module;
inflating a liner coupled to an inner surface of the transfer chamber, wherein the inflated liner is separated from the substrate;
pumping down the transfer chamber to a vacuum pressure level; and
transferring the substrate from the transfer chamber to a processing chamber of a processing module.

19. The method of claim 18, wherein the inflating the liner and the pumping down the transfer chamber are performed simultaneously.

20. The semiconductor device manufacturing system of claim 1, wherein the transfer module further comprises an interface fitting protruding into the liner.

* * * * *

UNITED STATES PATENT AND TRADEMARK OFFICE
CERTIFICATE OF CORRECTION

PATENT NO. : 11,031,264 B2  
APPLICATION NO. : 16/443168  
DATED : June 8, 2021  
INVENTOR(S) : Liu et al.

Page 1 of 1

It is certified that error appears in the above-identified patent and that said Letters Patent is hereby corrected as shown below:

On the Title Page

Item [73], delete "Semoconductor" and insert --Semiconductor--, therefor.

In the Specification

Column 2, Line 51, delete "(e.g." and insert --"(e.g.,"-- at each occurrence throughout the Patent.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*